(12) United States Patent
Kim

(10) Patent No.: US 11,394,350 B2
(45) Date of Patent: *Jul. 19, 2022

(54) METHOD AND SYSTEM FOR ALIGNING SIGNALS WIDELY SPACED IN FREQUENCY FOR WIDEBAND DIGITAL PREDISTORTION IN WIRELESS COMMUNICATION SYSTEMS

(71) Applicant: DALI SYSTEMS CO. LTD., Grand Cayman (KY)

(72) Inventor: Wan Jong Kim, Port Moody (CA)

(73) Assignee: Dali Systems Co. Ltd., George Town (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/352,065

(22) Filed: Mar. 13, 2019

(65) Prior Publication Data

US 2020/0052659 A1     Feb. 13, 2020

Related U.S. Application Data

(60) Continuation of application No. 14/956,040, filed on Dec. 1, 2015, now Pat. No. 10,263,569, which is a
(Continued)

(51) Int. Cl.
*H03F 1/26* (2006.01)
*H03F 1/32* (2006.01)
(Continued)

(52) U.S. Cl.
CPC ......... *H03F 1/3247* (2013.01); *H03F 1/3258* (2013.01); *H03F 3/189* (2013.01);
(Continued)

(58) Field of Classification Search
CPC ........ H03F 1/3247; H03F 3/24; H03F 1/3258; H03F 3/189; H03F 3/245;
(Continued)

(56) References Cited

U.S. PATENT DOCUMENTS 6,741,663 B1   5/2004  Tapio et al.
6,774,834 B2   8/2004  Dartois
(Continued)

FOREIGN PATENT DOCUMENTS

CN   1550064 A   11/2004
CN   1969459 A    5/2007
(Continued)

OTHER PUBLICATIONS

English Summary of First Office Action dated Aug. 19, 2019 for Korean Application No. 10-2015-7004064, pp. all.
(Continued)

*Primary Examiner* — Khanh V Nguyen
*Assistant Examiner* — Khiem D Nguyen
(74) *Attorney, Agent, or Firm* — Artegis Law Group, LLP

(57) ABSTRACT

A system for time aligning widely frequency spaced signals includes a digital predistortion (DPD) processor and a power amplifier coupled to the DPD processor and operable to provide a transmit signal at a power amplifier output. The system also includes a feedback loop coupled to the power amplifier output. The feedback loop comprises an adaptive fractional delay filter, a delay estimator coupled to the adaptive fractional delay filter, and a DPD coefficient estimator coupled to the delay estimator.

17 Claims, 3 Drawing Sheets

Related U.S. Application Data division of application No. 13/945,736, filed on Jul. 18, 2013, now Pat. No. 9,225,296.

(60) Provisional application No. 61/674,771, filed on Jul. 23, 2012.

(51) Int. Cl.

| | |
|---|---|
| *H04L 25/03* | (2006.01) |
| *H04L 27/00* | (2006.01) |
| *H03F 3/189* | (2006.01) |
| *H03F 3/24* | (2006.01) |
| *H04L 43/028* | (2022.01) |
| H04L 27/26 | (2006.01) |

(52) U.S. Cl.
CPC ............. *H03F 3/24* (2013.01); *H03F 3/245* (2013.01); *H04L 25/03063* (2013.01); *H04L 27/0002* (2013.01); *H04L 43/028* (2013.01); H03F 2200/336 (2013.01); H03F 2200/451 (2013.01); H04L 25/03343 (2013.01); H04L 27/2627 (2013.01); H04L 27/2655 (2013.01)

(58) Field of Classification Search
CPC ......... H03F 2200/451; H03F 2200/336; H04L 43/028; H04L 25/03063; H04L 27/0002; H04L 27/2655; H04L 27/2627; H04L 25/03343
USPC ........................ 330/149; 375/297; 455/114.3
See application file for complete search history.

(56) References Cited

U.S. PATENT DOCUMENTS

| | | | |
|---|---|---|---|
| 6,798,843 | B1 | 9/2004 | Wright et al. |
| 6,943,627 | B2 | 9/2005 | Leyonhjelm et al. |
| 7,602,244 | B1 | 10/2009 | Holmes et al. |
| 9,225,296 | B2 | 12/2015 | Kim |
| 10,263,569 | B2 * | 4/2019 | Kim .................. H04L 25/03063 |
| 2001/0005402 | A1 | 6/2001 | Nagatani et al. |
| 2004/0246048 | A1 | 12/2004 | Leyonhjelm et al. |
| 2005/0190857 | A1 | 9/2005 | Braithwaite |
| 2007/0188225 | A1 | 8/2007 | Shako et al. |
| 2008/0130798 | A1 | 6/2008 | Ohba et al. |
| 2010/0026354 | A1 | 2/2010 | Utsunomiya |
| 2010/0295611 | A1 | 11/2010 | Hamano |
| 2011/0038400 | A1 | 2/2011 | Ishikawa et al. |
| 2011/0156815 | A1 | 6/2011 | Kim et al. |
| 2011/0274210 | A1 | 11/2011 | Chekhovstov et al. |

FOREIGN PATENT DOCUMENTS

| | | |
|---|---|---|
| EP | 1914884 B1 | 6/2016 |
| JP | 2001189685 A | 7/2001 |
| JP | 2002514028 A | 5/2002 |
| JP | 2006524832 A | 11/2006 |
| JP | 2007221244 A | 8/2007 |
| JP | 2010273064 A | 12/2010 |
| JP | 2011041049 A | 2/2011 |
| JP | 2011091499 A | 5/2011 |
| KR | 20080018964 A | 2/2008 |
| WO | 0217586 A1 | 2/2002 |
| WO | 03019773 A1 | 3/2003 |
| WO | WO 2004/097794 | 11/2004 |
| WO | WO 2007/013177 | 2/2007 |
| WO | 2014018379 A1 | 1/2014 |

OTHER PUBLICATIONS

Diaz-Carmona, et al., "Fractional Delay Digital Filters", Application of MATLAB in Science and Engineering; http://www.intechopen.com/donwload/get/type/pdfs/id/18566, 2011, pp. 247-273.
Office Action, App. No. 13823723.5, dated Jun. 29, 2017, 6 pages.
Extended European Search Report, Application No. 13823723.5, dated Jan. 28, 2016, 8 pages.
Notice of Reasons for Rejections, App. No. 2015-524332, dated Oct. 2, 2018, 20 pages.
Office Action, App. No. 2015-524332, dated Aug. 15, 2017, 12 pages.
International Preliminary Report on Patentability, Application No. PCT/US2013/051149, dated Feb. 5, 2015, 7 pages.
International Search Report and Written Opinion, Application No. PCT/U2013/051149, dated Jan. 9, 2014, 8 pages.
Pun, et al., An Efficient Design of Fractional-Delay Digital FIR Filters Using the Farrow Structure, Proceedings of the 11th IEEE Signal Processing Workshop on Statistical Signal Processing, Aug. 2001, p. 595-598.
Pun, Carson K.S., et al. "An Efficient Design or Fractional-Delay Digital FIR Filters Using the Farrow Structure" The 11th IEEE Signal Processing Workshop on Statistical Signal Processing Proceedings, Aug. 2001.
Official Action (Including Translation) for Brazilian Application No. BR 11 2015 001348 1, dated Jun. 30, 2020.
First Office Action for Chinese Application No. 201380039353.6, dated Apr. 28, 2017.
Office Action for Chinese Application No. 201380039353.6, dated Oct. 12, 2018.
Notification to Grant Patent Right for Invention (Including Translation) for Chinese Application No. 201380039353.6, dated Apr. 4, 2019.
Office Action for European Application No. 13823723.5, dated Nov. 4, 2016.
Office Action for European Application No. 13823723.5, dated Mar. 19, 2018.
Office Action for European Application No. 13823723.5, dated Feb. 15, 2019.
Office Action for European Application No. 13823723.5, dated Sep. 20, 2019.
Intent to Grant for European Application No. 13823723.5, dated Feb. 28, 2020.
Office Action for Israel Application No. 236619, dated Sep. 12, 2017.
Notice of Acceptance for Israel Application No. 236619, dated May 21, 2018.
Office Action (Including Translation) for Israel Application No. 259447, dated Jan. 10, 2019.
Examination Report for Indian Patent Application No. 211/CHENP/2015, dated Jan. 10, 2020.
Decision to Grant A Patent (including Translation) for Japanese Patent Application No. 2015-524332, dated May 14, 2019.
Notice of Allowance (Including Translation) for Korean Application No. 10-2015-7004064, dated May 21, 2020.
Office Action for U.S. Appl. No. 13/945,736, dated Jan. 16, 2015.
Notice of Allowance for U.S. Appl. No. 13/945,736, dated Aug. 24, 2015.
Office Action for U.S. Appl. No. 14/956,040 dated Jan. 6, 2017.
Office Action for U.S. Appl. No. 14/956,040 dated Sep. 8, 2017.
Office Action for U.S. Appl. No. 14/956,040 dated May 10, 2018.
Notice of Allowance for U.S. Appl. No. 14/956,040 dated Dec. 13, 2018.
European Search Report for European Application No. 20186758.7, dated Nov. 2, 2020.

* cited by examiner

METHOD AND SYSTEM FOR ALIGNING SIGNALS WIDELY SPACED IN FREQUENCY FOR WIDEBAND DIGITAL PREDISTORTION IN WIRELESS COMMUNICATION SYSTEMS

CROSS-REFERENCES TO RELATED APPLICATIONS

This application a continuation of U.S. patent application Ser. No. 14/956,040, filed Dec. 12, 2015, which is a divisional of U.S. patent application Ser. No. 13/945,736, filed Jul. 18, 2013, now U.S. Pat. No. 9,225,296, which claims the benefit of U.S. provisional patent application No. 61/674,771, filed Jul. 23, 2012, the disclosures of which are hereby incorporated by reference.

BACKGROUND OF THE INVENTION

Predistortion is a technique used in communications systems to improve the linearity of power amplifiers. Because power amplifiers can have nonlinear input/output characteristics, predistortion is used to linearize the input/output characteristics of the power amplifier. In essence, "inverse distortion" is introduced into the input fed to the power amplifier, thereby cancelling the non-linear characteristics of the power amplifier.

Current predistortion technologies used to linearize power amplifiers in mobile communication systems are mainly analog predistorters implemented at IF/RF by means of analog circuitry and a digital predistorter at baseband with digital signal processing (DSP) techniques.

The analog predistorter is based on the principle of error subtraction and power matching to produce linearization of the power amplifier. Because nonlinear characteristics of power amplifiers can be complicated and involve many variables, analog predistortion results in less than optimal predistortion accuracy and consumes significant power.

Despite the progress made in predistortion technologies, there is a need in the art for improved methods and systems for digital predistortion systems.

SUMMARY OF THE INVENTION

Accordingly, the present invention has been made in view of the above problems, and it is an object of the present invention to provide a robust method of estimating delay between the transmit and feedback signals for a wideband digital predistortion system. To achieve the above objective, according to an embodiment of the present invention, the technique is based on using a Farrow based fractional delay filter in the feedback path and an algorithm in order to accurately control the feedback path delay. Embodiments of the present invention are able to time align transmit and feedback signals with high accuracy at any time.

According to an embodiment of the present invention, a simple and robust delay estimation method for wideband digital predistortion with widely frequency spaced carriers is provided. The present invention provides a method of time aligning a transmit and feedback signal, for a wideband digital predistortion system. To achieve the above objective, according to an embodiment of the present invention, the technique is based on using a programmable fractional delay filter based on a third order Lagrange Farrow structure which is very simple to design and control. Embodiments described herein are able to align signals, in digital predistortion systems, with more than an instantaneous 100 MHz bandwidth.

According to an embodiment of the present invention, a system for time aligning widely frequency spaced signals is provided. The system includes a digital predistortion (DPD) processor and a power amplifier coupled to the DPD processor and operable to provide a transmit signal at a power amplifier output. The system also includes a feedback loop coupled to the power amplifier output. The feedback loop includes an adaptive fractional delay filter, a delay estimator coupled to the adaptive fractional delay filter, and a DPD coefficient estimator coupled to the delay estimator.

According to another embodiment of the present invention, a method of temporally aligning signals is provided. The method includes a) computing a value of a delay parameter, b) receiving a plurality of transmit signals, and c) receiving a plurality of feedback signals. The method also includes d) determining a function related to a timing error using the plurality of transmit signals and the plurality of feedback signals, e) determining that the function related to the timing error is greater than or equal to a predetermined threshold, and f) incrementing a counter. The method further includes g) repeating one or more of a) through f) one or more times, h) determining that the function related to the timing error is less than the predetermined threshold, and i) fixing the delay parameter.

Numerous benefits are achieved by way of the present invention over conventional techniques. For example, embodiments of the present invention provide for enhanced control of delay in the feedback path, improving the performance characteristics of the digital predistortion system. These and other embodiments of the invention along with many of its advantages and features are described in more detail in conjunction with the text below and attached figures.

DETAILED DESCRIPTION OF SPECIFIC EMBODIMENTS

The present invention generally relates to wideband communication systems using multiplexing modulation techniques. More specially, the present invention relates to a method of aligning widely frequency spaced signals for wideband digital predistortion linearization in wireless transmitters.

The linearity and efficiency of radio frequency (RF) power amplifiers (PAs) have been a critical design issue for non-constant envelope digital modulation schemes which have high peak to average power ratio (PARs), with the increasing importance of spectral efficiency in wireless communication systems. RF PAs have nonlinearities which generate amplitude modulation—amplitude modulation (AM-AM) and amplitude modulation—phase modulation (AM-PM) distortion at the output of the PA. These effects create spectral regrowth in the adjacent channels and in-band distortion which degrades the error vector magnitude (EVM). Therefore, one of the various linearization techniques is typically applied to the RF PAs. Various linearization techniques have been proposed in the literature such as feedback, feedforward and predistortion.

The most promising linearization technique is baseband digital predistortion (DPD), which takes advantage of the recent advances in digital signal processors. DPD can achieve good linearity, good power efficiency with a reduced system complexity when compared to the widely used conventional feedforward linearization technique. Moreover, a software implementation provides the digital predistorter with re-configurability suitable for the multi-standard environments. In addition, a PA using efficiency enhancement technique such Doherty power amplifier (DPA) is able to achieve higher efficiencies than traditional PA designs at the expense of linearity. Therefore, combining DPD with a DPA using efficiency enhancement technique has the potential of maximizing system linearity and overall efficiency.

The typical wireless communication systems instantaneous bandwidth supports around 20 MHz to 25 MHz. The common delay estimation for digital predistortion algorithm uses magnitude correlation between the transmit signal and feedback signal with two times or more oversampling.

However, requirements of the instantaneous bandwidth (>25 MHz) for next generation wireless system continue to increase, which means that wideband multicarrier can be widely frequency spaced, for example, carrier spacing can be up to 60 MHz for systems supporting 65 MHz of instantaneous bandwidth. This can create several correlation peaks with a very small time difference due to the large carrier spacing. This can cause a large delay alignment error, which is undesirable. Thus, embodiments of the present invention provide a wideband digital predistortion system with robust delay estimation.

Figure 1:
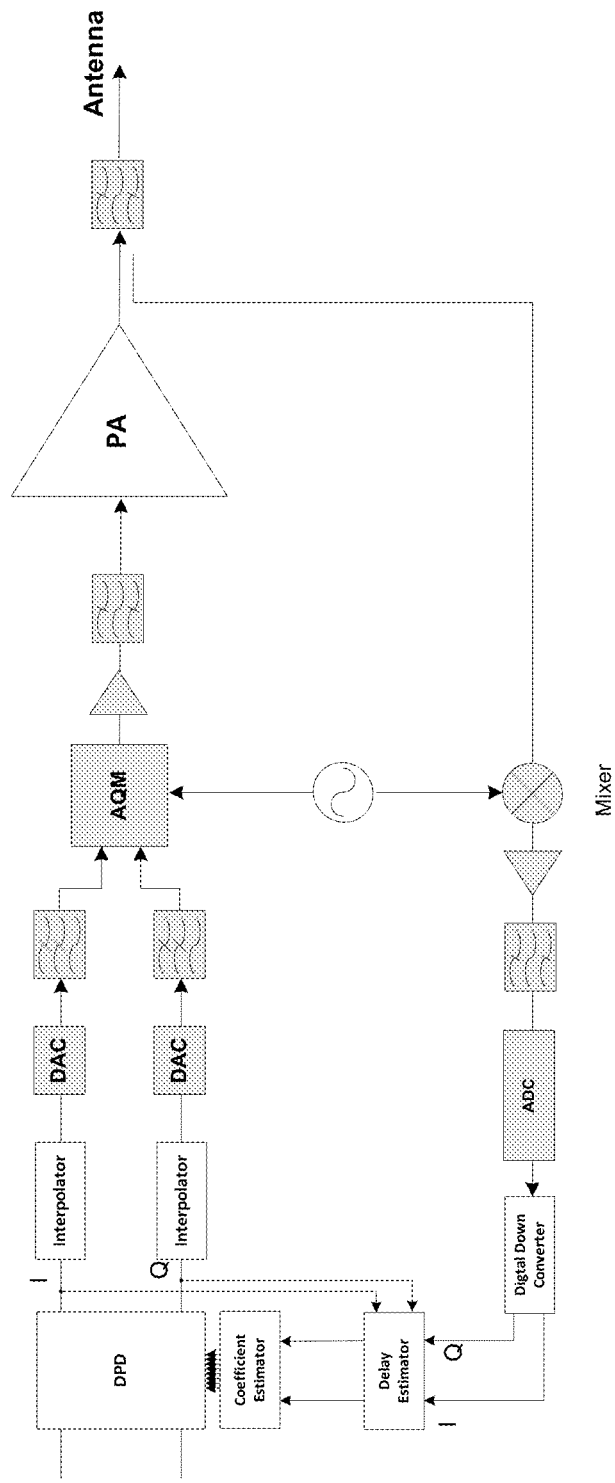
FIG. 1. is a schematic block diagram illustrating a multi-carrier wideband system including digital predistortion with delay estimation according to an embodiment of the present invention.

FIG. 1 is a schematic block diagram showing digital predistortion (DPD) circuits, interpolators, digital-to-analog converters, a modulator, a power amplifier, a duplexer, radio frequency down-conversion circuits for the output coupled at the output of the PA, an analog-to-digital converter for digital predistortion feedback path, and a digital down-converter. The digital predistortion system utilizes a delay estimation based on the magnitude of complex signals (I and Q). Normally, the sample rate of the feedback ADC is twice that of the digital pre-distorter. For example, if the digital predistortion sample rate is 125 MHz, then sample rate of feedback ADC is typically at least 250 MHz, which means that minimum resolution of the hardware controllable delay is 4 ns (1/250 MHz). In some implementations, this minimum resolution is not small enough to align the delay between transmit and feedback path with desired accuracy in the case of widely frequency spaced carriers.

The delay estimator receives inputs from the feedback path as well as inputs from the output of the DPD circuit. The delay estimator calculates the difference between these inputs and provides inputs to the coefficient estimator in order to time align the signals as part of the error minimization process. In some embodiments of the present invention, the delay estimator provides a value, which is a function of the timing error between the in-phase component at the output of the DPD circuit and the in-phase component of the feedback signal and the quadrature-phase component at the output of the DPD circuit and the quadrature-phase component of the feedback signal.

As an example of the computation of the function of the timing error, which can also be referred to as a function related to the timing error, the function can be the mean squared error difference between the complex feedback signal and the complex output of the DPD circuit.

$$\text{Error} = (\hat{I}-I)^2 + (\hat{Q}-Q)^2$$

where: $\hat{I}$ is the in-phase feedback signal
$\hat{Q}$ is the quadrature-phase feedback signal
I is the in-phase output DPD signal
Q is the quadrature-phase output DPD signal FIG. 2. is a schematic block diagram showing a system for aligning wideband signals according to an embodiment of the present invention. The system illustrated in FIG. 2 includes digital predistortion (DPD) circuits, interpolators, digital-to-analog converters, a modulator, a power amplifier, a duplexer, radio frequency down-conversion circuits for the output coupled at the output of the PA, an analog-to-digital converter for feedback path, a digital down-converter, and a fractional delay filter with controllable parameter (mu) which ranges 0 to 1 in some embodiments.

According to a present invention of the present invention, the fractional delay filter is implemented based on a third order Lagrange Farrow structure that enables a simple implementation and operates at the digital predistortion sample rate. A higher order Lagrange Farrow filter can be used as appropriate to the particular application. Minimum delay resolution can be 10 times the sample rate or higher, which means that it can be as small as 0.1 ns for a feedback ADC having a sample rate of 1 GHz. Of course, the minimum delay resolution will depend on the number of bits in some implementations. In order to provide a similar minimum delay, conventional systems would use a 10 GHz sample rate interpolator in hardware or complicated and time consuming software filtering algorithm.

Figure 2:
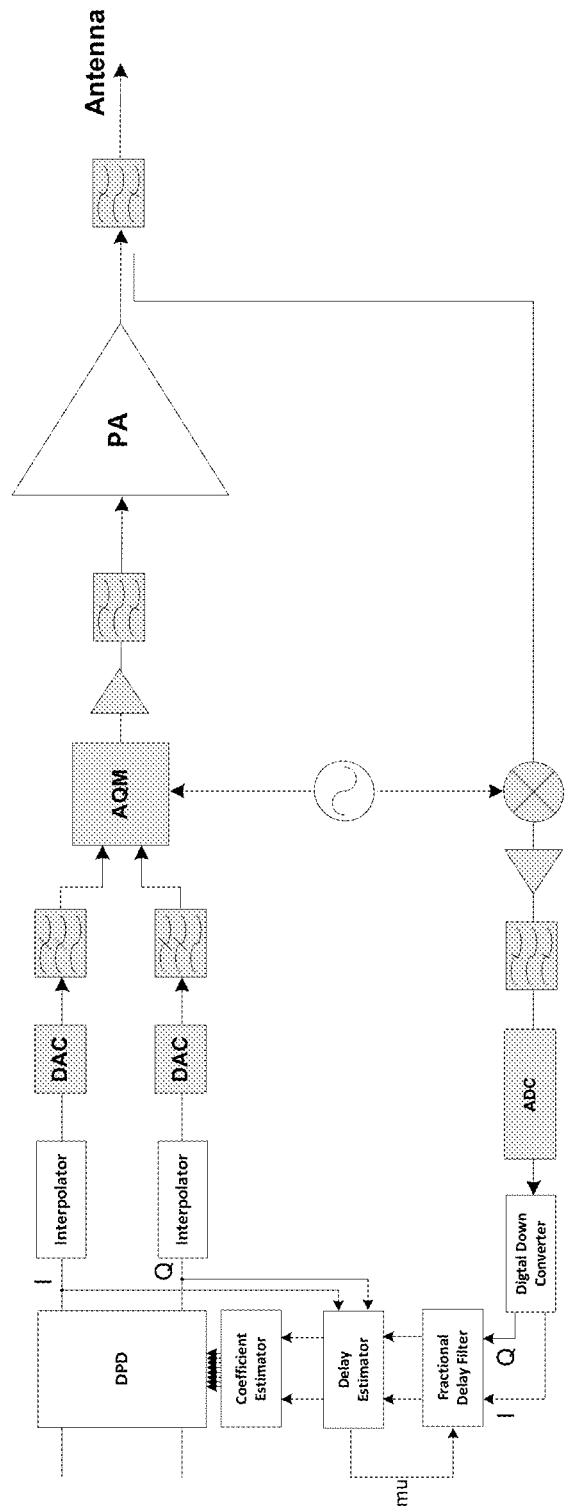
FIG. 2. is a schematic block diagram showing a system for aligning wideband signals according to an embodiment of the present invention.

The fractional delay filter allows for shifting of the signal (i.e., time shifting of a signal) by fractions of the sampling rate. As an example, if the sampling rate were 100 MHz, a conventional system would only sample at a rate resulting in 10 ns (i.e., 1/100 MHz) between each sample. As illustrated in FIG. 2, the fractional delay filter includes a parameter illustrated as mu. The parameter enables shifting of the signal to change the delay by a predetermined fraction of the sampling rate, for example, one-tenth of the sampling rate. Thus, the fractional delay filter enables reduction in minimum delays from 10 ns to 1 ns for a mu value ranging from 0 to 1. Embodiments of the present invention thus utilize fractional delay filtering in the context of digital predistortion in wideband communications systems.

Referring once again to FIG. 2, the fractional delay filter serves as a low pass filter with variable delay as a function of the parameter mu. Additional description related to the variation of the parameter mu during operation is provided below.

Figure 3:
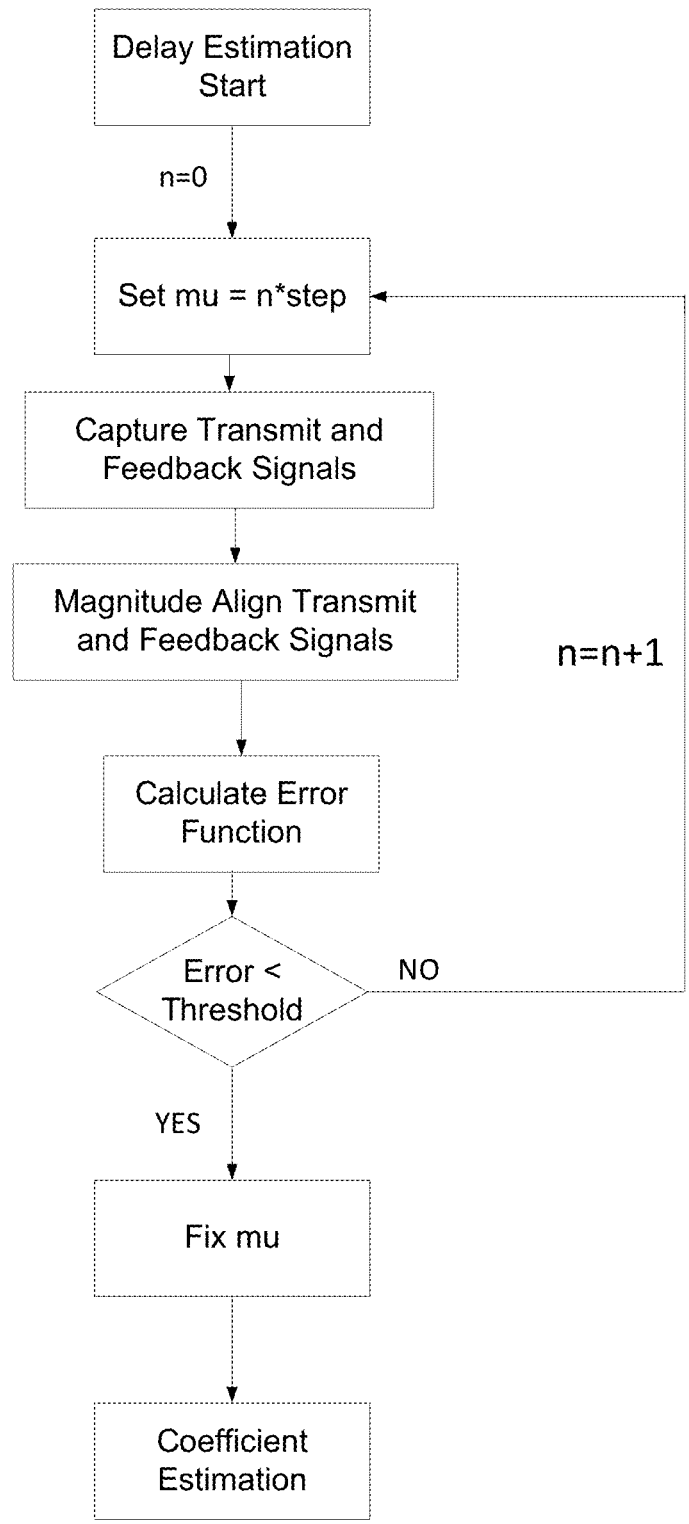
FIG. 3 is a simplified flowchart illustrating a method of temporally aligning signals according to an embodiment of the present invention.

FIG. 3. is a flow chart illustrating a method of temporally aligning signals according to an embodiment of the present invention. When delay estimation starts, a counter (n) is set to zero and mu is set to the value of the counter times a step size (mu=n*step), setting mu to zero. The step size can be set to a variety of values, for example, 0.2, 0.1, 0.05, or the like. As an example, if the ADC is operating at a sample rate of 1 MHz (i.e., 1 µs per sample) and the step size is set to 0.1, then mu will be set to multiples of 0.1 as the counter is incremented in order to provide a minimum delay resolution of 0.1 µs.

Signals are captured at the outputs of the DPD circuit and the output of the feedback path (i.e., the outputs of the digital down converter). The output of the DPD circuit, and the output of the feedback path are magnitude aligned. Using the aligned captured signals of the two paths, a calculation of the function of the timing error is performed in the delay estimator as illustrated in FIG. 2. During the first iteration, n=0 and mu=0, providing the parameter mu=0 to the fractional delay filter. If the resulting function of the timing error is larger than or equal to a predetermined threshold, the counter is incremented and mu is recomputed for the next iteration (i.e., mu=1*step=1*0.1=0.1 for the second iteration in this example). The process iterates until the function of the timing error is less than the predetermined threshold, mu is fixed, and the values from the delay estimator are provided to the coefficient estimator (i.e., the coefficient estimation algorithm). The step size is not limited to the value of 0.1 in this example and can be set at other values as appropriate, for example, 0.2, 0.1, 0.05, or the like.

Embodiments of the present invention provide for adaptive processing in real time to reduce signal error to a predetermined level. As will be evident to one of skill in the art, a predetermined number of symbols are captured (e.g., 4000 samples), a calculation of the function of the timing error is performed to determine the delay estimation value and then the coefficient estimator is provided with the delay.

Referring to FIG. 3, a method of temporally aligning signals is provided. The method includes a) computing a value of a delay parameter, b) receiving a plurality of transmit signals, and c) receiving a plurality of feedback signals. As illustrated in FIG. 3, computing the value of the delay parameter can include multiplying the counter times a step size parameter. The step size parameter can range from 0 to 1. The method also includes d) determining a function of the timing error using the plurality of transmit signals and the plurality of feedback signals and e) determining that the function of the timing error is greater than or equal to a predetermined threshold. Determining the function of the timing error using the plurality of transmit signals and the plurality of feedback signals can include filtering the plurality of transmit signals and the plurality of feedback signals and estimating the timing error.

The method further includes f) incrementing a counter and g) repeating a) through f) one or more times. In some embodiments, a subset of a) through f) are repeated one or more times. As illustrated in FIG. 3, the iteration of a) through f) is performed as long as the function of the timing error is greater than or equal to the predetermined threshold.

After a number of iterations and increases in the value of the delay parameter, the method includes h) determining that the function of the timing error is less than the predetermined threshold and i) fixing the delay parameter. In an embodiment, the method also includes estimating predistortion coefficients using the delay parameter.

It should be appreciated that the specific steps illustrated in FIG. 3 provide a particular method of temporally aligning signals according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system comprising:
    a digital predistortion (DPD) processor;
    a power amplifier coupled to the DPD processor and operable to provide a transmit signal at a power amplifier output; and
    a feedback loop coupled to the power amplifier output, wherein the feedback loop comprises:
        an analog-to-digital converter (ADC) coupled to the power amplifier output and outputting a feedback signal, wherein the ADC has a sampling rate;
        an adaptive fractional delay filter coupled to the ADC unit and comprising a delay parameter, wherein the adaptive fractional delay filter is configured to delay the feedback signal by a delay that is variable based on a fraction of the sampling rate and on the delay parameter;
        a delay estimator coupled to the adaptive fractional delay filter and configured to set the delay parameter; and
        a DPD coefficient estimator coupled to the delay estimator.

2. The system of claim 1, wherein the delay estimator further comprises a control algorithm.

3. The system of claim 1, wherein the adaptive fractional delay filter comprises a third or higher order Lagrange Farrow filter.

4. The system of claim 1, wherein the delay estimator is operable to calculate a function of a timing error.

5. The system of claim 4, wherein the delay estimator is operable to calculate the function of the timing error by filtering the transmit signal and an output of the adaptive fractional delay filter.

6. The system of claim 4, wherein the function of the timing error comprises a magnitude squared function.

7. The system of claim 4, wherein the function of the timing error comprises a magnitude peak correlation function.

8. The system of claim 4, wherein the function of the timing error comprises an error vector magnitude (EVM) function.

9. The system of claim 1, wherein the adaptive fractional delay filter is a low pass filter.

10. The system of claim 1, wherein the DPD coefficient estimator is operable to estimate predistortion coefficients using the delay parameter.

11. The system of claim 1, wherein the delay parameter is calculated by a counter multiplied by a step size parameter.

12. The system of claim 11, wherein the step size parameter ranges from 0 to 1.

13. The system of claim 1, wherein the delay parameter ranges from 0 to 1.

14. A system comprising:
    a digital predistortion (DPD) processor including an output operable to output a predistorted signal;
    a power amplifier coupled to the DPD processor and operable to provide a transmit signal at a power amplifier output; and
    a feedback loop coupled to the power amplifier output, wherein the feedback loop comprises:
        an analog-to-digital converter (ADC) coupled to the power amplifier output and outputting a feedback signal, wherein the ADC unit has a sampling rate;

an adaptive fractional delay filter coupled to the ADC and comprising a delay parameter;

a delay estimator coupled to the adaptive fractional delay filter and the output of the DPD processor and configured to determine a delay between the predistorted signal and the feedback signal, wherein the delay is variable based on a fraction of the sampling rate of the ADC unit and on the delay parameter, wherein the delay estimator is further configured to set the delay parameter; and a DPD coefficient estimator coupled to the delay estimator.

15. The system of claim 14, wherein the transmit signal comprises an in-phase signal and a quadrature-phase signal and the feedback signal comprises an in-phase feedback signal and a quadrature-phase feedback signal.

16. The system of claim 14, wherein the delay is a function of a delay parameter equal to a counter multiplied by a step size parameter.

17. The system of claim 16, wherein the delay equals the delay parameter divided by the sampling rate.

* * * * *